(12) United States Patent
Pekin et al.

(10) Patent No.: US 6,403,399 B1
(45) Date of Patent: Jun. 11, 2002

(54) METHOD OF RAPID WAFER BUMPING

(75) Inventors: Senol Pekin; Kang-rong Chiang, both of San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/636,498

(22) Filed: Aug. 11, 2000

(51) Int. Cl.$^7$ ................................. H01L 21/44
(52) U.S. Cl. ................. 438/118; 438/119; 438/612; 438/613; 438/614; 438/615; 228/178; 228/180.22; 228/248.1; 219/121.63
(58) Field of Search ................. 438/118, 119, 438/612, 613, 614, 615; 228/248.1, 178, 180.22; 219/121.63

(56) References Cited

U.S. PATENT DOCUMENTS 5,133,987 A * 7/1992 Spence et al. ............ 427/53.1
5,159,171 A * 10/1992 Cook et al. ............ 219/121.63
5,282,565 A * 2/1994 Melton ................. 228/180.22
5,738,269 A * 4/1998 Masterton ................ 228/248.1
5,870,307 A * 2/1999 Hull et al. ............. 364/474.24
5,965,197 A * 10/1999 Jin et al. ..................... 427/180
6,173,887 B1 * 1/2001 Mead et al. ............. 228/248.1

FOREIGN PATENT DOCUMENTS

JP          61-190955    *  8/1986
JP           2-6055      *  1/1990

* cited by examiner

Primary Examiner—John F. Niebling
Assistant Examiner—Lynne A. Gurley
(74) Attorney, Agent, or Firm—Fitch, Even, Tabin & Flannery

(57) ABSTRACT

A method for wafer bumping includes the steps of spreading a layer of an electrically conductive paste on a surface having a plurality of electrical contacts and exposing a beam-paste interaction volume to a beam of energy to bond a portion of the layer of the electrically conductive paste to at least one of the plurality of electrical contacts for forming a wafer bump.

9 Claims, 3 Drawing Sheets

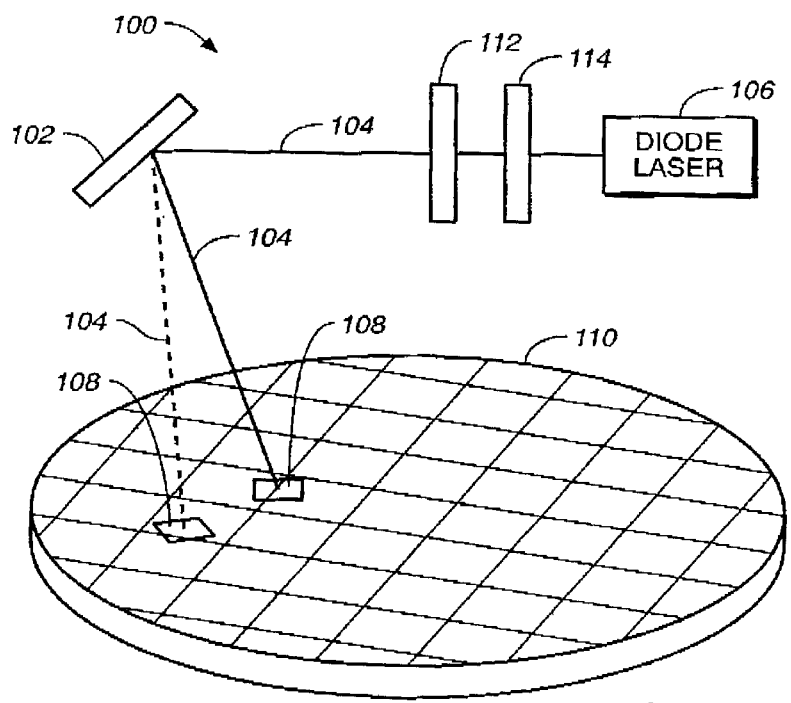
FIG._1
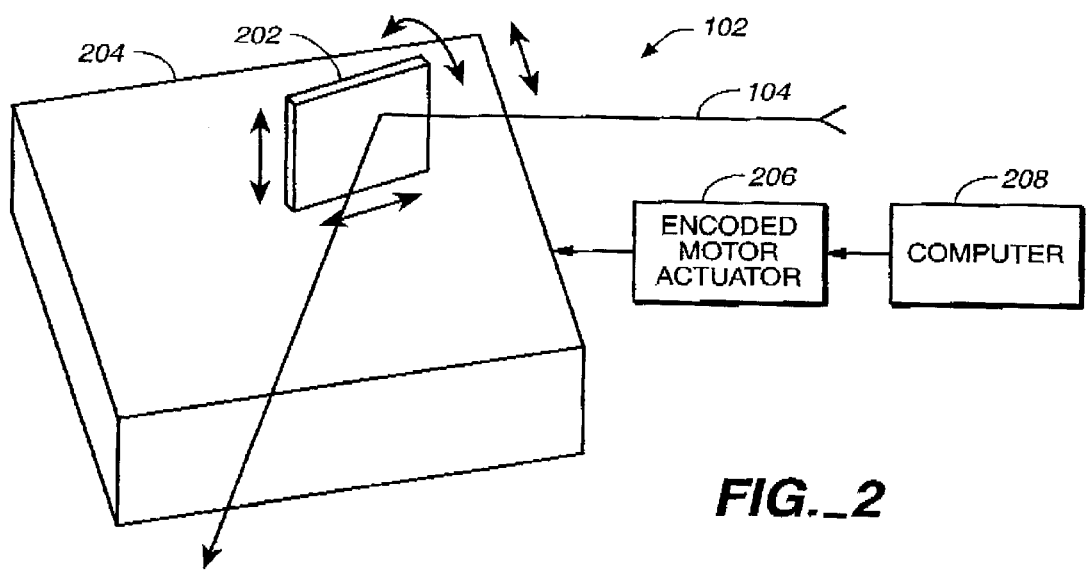
FIG._2

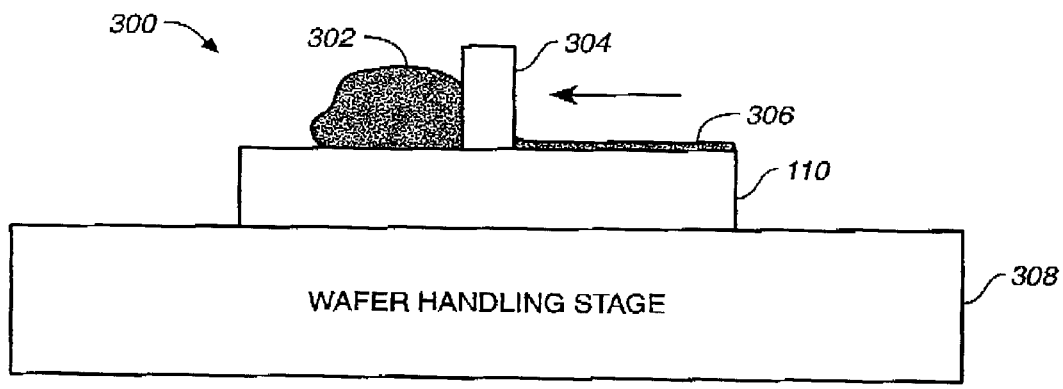
FIG._3
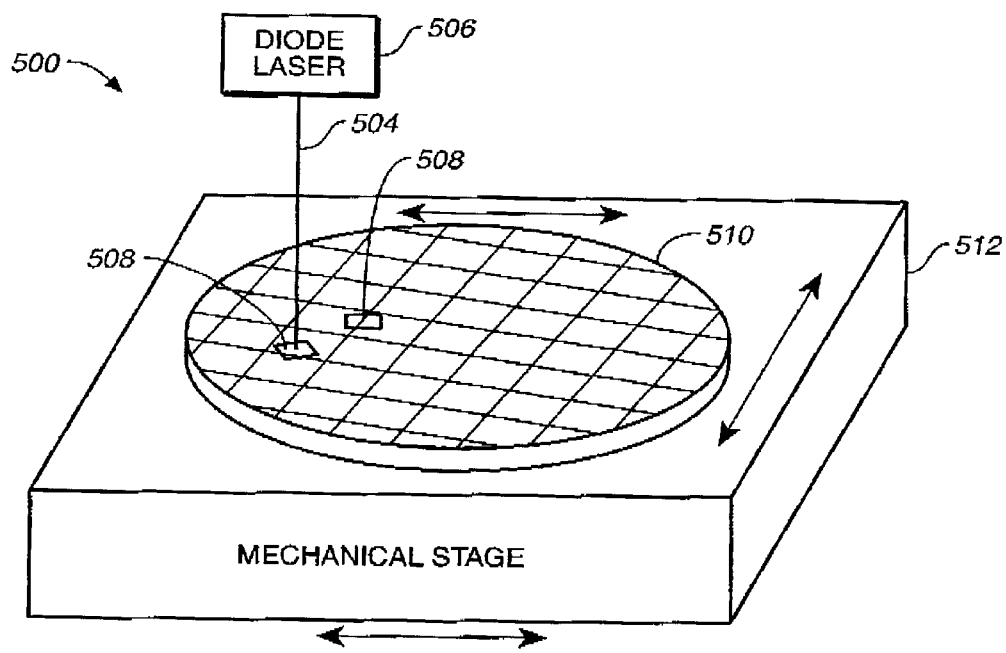
FIG._5

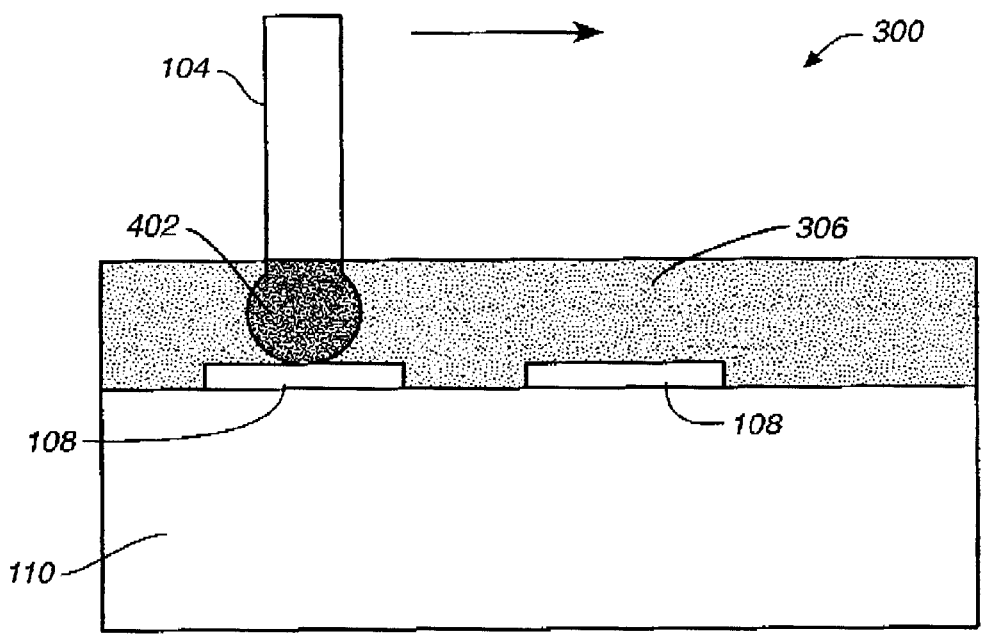
FIG._4A
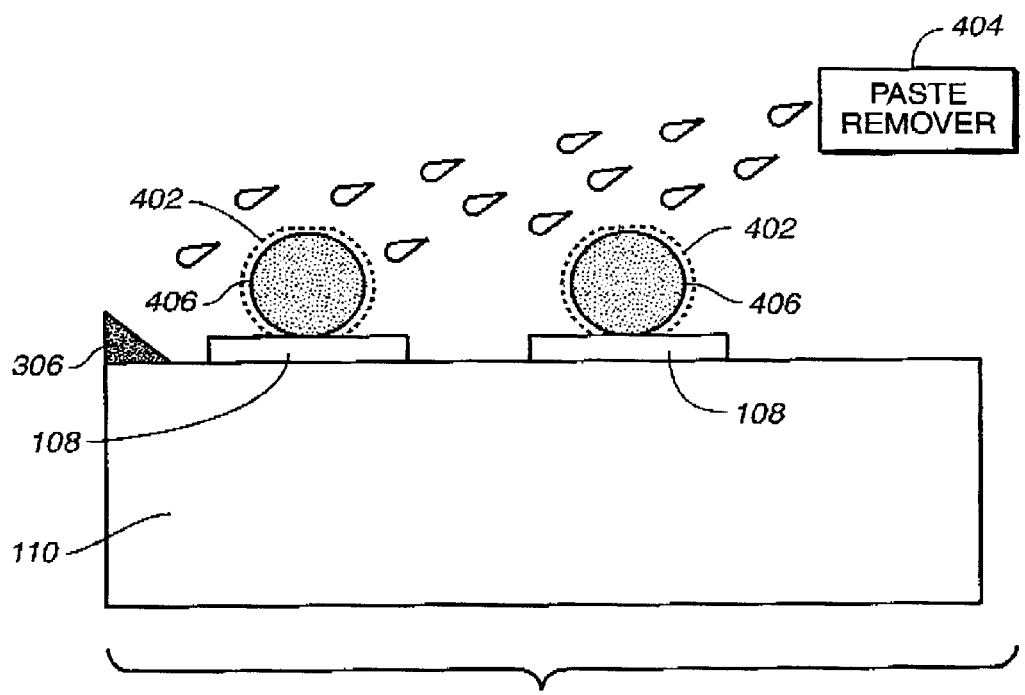
FIG._4B

METHOD OF RAPID WAFER BUMPING

BACKGROUND OF THE INVENTION

The present invention relates generally to microelectronic packaging, and more specifically to wafer bumping for forming interconnections between a die and a substrate within a package.

Microelectronic packaging may be described as the art and science of establishing interconnections between a die (or a chip) and an application environment in a reliable, functional, and cost effective manner. The die contains the integrated circuit (IC). In most electronic products, there are four major IC devices: the microprocessor, the ASIC (application-specific IC), the cache memory, and the main memory. There are various methods of packaging, including but not limited to PBGA (Plastic Ball Grid Array), CBGA (Ceramic Ball Grid Array), TCP (Tape Carrier Package), and Area-Array Flip Chip Technology.

In Area-Array Flip Chip Technology, the most fundamental level of interconnection is established by wafer bumps, which are typically in the form of solder balls formed on each I/O pad of the die. The wafer bumps have a typical diameter of about 100 microns, and the bump-to-bump distance, or bump pitch, is typically about 225 microns. The process of making bumps on the wafer is called "wafer bumping."

Current techniques for wafer bumping require design-specific tooling for each new wafer design. The time and cost of manufacturing the tooling is reflected in the new package development cycle, and may result in loss of market share. A recent McKinsey study showed that shipping a product six months late results in a 33 percent loss of the product's lifetime profit.

Several factors are important to consider in choosing a wafer bumping technique. Some techniques are suitable for wafer bumping a large number of wafers of the same design, other techniques are not. Other important factors are the yield statistics and the number of bumps per wafer.

Wafer bumps are generally made of a solder compound. The solder material is placed on the I/O pads of each die on the wafer, and the wafer is passed through one or two re-flow processes to bond the solder to the I/O pads, which gives each bump a spherical shape.

One wafer bumping technique uses a stencil specifically made for each wafer design. The stencil masks the areas outside the I/O pads where the solder compound is unwanted, and a thin layer of solder paste is deposited by, for example, a doctor's blade or a squeegee. The stencil is removed, and the wafer is passed through a re-flow process to melt the paste and to shape the wafer bumps on the I/O pads. Besides requiring a new stencil for each new wafer design, stencils are subject to wear and require regular replacement. Also, the bump yield using stencils is subject to defects in the stencil. Another disadvantage of the stencil technique is that the bump diameter may fluctuate by as much as 20 to 30 microns.

As the requirements for microelectronic devices increase, the number of wafer bumps per die (chip) increases, consequently the wafer bump size must decrease. A current goal is to attach 400,000 wafer bumps onto a wafer having a diameter of 20 cm (8 in). After wafer bumping, the wafer is cut into dice. Preferably, at least 99 percent of the dice should be free of wafer bump defects. A yield this high is statistically very difficult to obtain by currently available techniques.

Once the requirements for an application-specific IC package are determined, an ASIC supplier may develop more than one device design. Before a package is finally qualified, various package builds are evaluated for engineering and prototyping purposes. Specifically, for the pre-mass production stage, there is a need for a rapid and reliable wafer bumping technique so that various device designs and package builds can be evaluated. Preferably, such a technique would also have applications in mass production.

SUMMARY OF THE INVENTION

The present invention advantageously addresses the needs above as well as other needs by providing a method and an apparatus for wafer bumping.

In one embodiment, the invention may be characterized as a method for wafer bumping that includes the steps of spreading a layer of an electrically conductive paste on a surface having a plurality of electrical contacts and exposing a beam-paste interaction volume to the beam of energy to bond a portion of the layer of the electrically conductive paste to at least one of the plurality of electrical contacts for forming a wafer bump.

In another embodiment, the invention may be characterized as an apparatus for wafer bumping that includes an energy source for generating a beam of energy and a positioning device for exposing a beam-paste interaction volume to the beam of energy to bond a portion of a layer of an electrically conductive paste to at least one of a plurality of electrical contacts for forming a wafer bump.

BRIEF DESCRIPTION OF THE DRAWINGS

The above and other aspects, features and advantages of the present invention will be more apparent from the following more specific description thereof, presented in conjunction with the following drawings wherein:

FIG. 1 is a pictorial diagram of a wafer bumping processor according to an embodiment of the present invention;

FIG. 2 is a pictorial diagram of a positioning device for the beam scanner for the wafer bumping processor of FIG. 1;

FIG. 3 is a pictorial diagram of a method for spreading a layer of an electrically conductive paste for use with the wafer bumping processor of FIG. 1;

FIG. 4A is an enlarged side view of a beam-paste interaction produced by the wafer bumping processor of FIG. 1;

FIG. 4B is an enlarged side view of the wafer bumps produced by the wafer bumping processor of FIG. 1; and FIG. 5 is a pictorial diagram of a wafer bumping processor according to another embodiment of the present invention in which the beam of energy is fixed and the processed wafer is positioned under the beam of energy by a mechanical stage.

Corresponding reference characters indicate corresponding elements throughout the several views of the drawings.

DETAILED DESCRIPTION OF THE DRAWINGS

The following description of the presently contemplated best mode of practicing the invention is not to be taken in a limiting sense, but is made merely for the purpose of describing the general principles of the invention. The scope of the invention should be determined with reference to the claims.

FIG. 1 is a pictorial diagram of a wafer bumping processor 100. Shown are a beam scanner 102, a beam of energy 104, an energy source 106, two I/O pads 108, a processed wafer 110, a beam modulator 112, and a focusing component 114.

The beam scanner 102 is a positioning device that directs the beam of energy 104 from the energy source 106 sequentially to each of the I/O pads (electrical contacts) 108 on the processed wafer 110. Only two I/O pads 108 are shown for clarity, but in practice, the number of I/O pads 108 may be, for example, about 400,000. The beam modulator 112 is coupled to the beam of energy 104 to pass a pulse of energy to each I/O pad 108 after the beam of energy 104 has settled. The focusing component 114 is coupled to the beam of energy 104 to concentrate the beam of energy within a volume over the I/O pad 108. The energy source 106 and the focusing component 114 should be capable of generating an adjustable spot size of the beam of energy 104 in the range of about 100 microns. The energy source 106 may be a diode laser as in this example, however other lasers and energy sources suitable for wafer bumping may also be used.

FIG. 2 is a pictorial diagram of a positioning device for the beam scanner 102 for the wafer bumping processor of FIG. 1. Shown are a mirror 202, a mechanical stage 204, an encoded motor actuator 206, and a computer 208. The mirror 202 is mounted on the mechanical stage 204 which rotates and translates the mirror to deflect the beam of energy 104 to each I/O pad 108. The beam scanner 102 may be, for example, a 6220 or 6230 Model Optical Scanner available from Cambridge Technology. Instead of moving the mirror 202, the energy source 106 may be mounted on the mechanical stage to position the beam of energy 104 over each I/O pad 108. The mechanical stage 204 may be, for example, a Newport Model PM500-33LR available from Newport Corporation. The mechanical stage 204 is driven by the encoded motor actuator 206, which may be, for example, an Encoder Mike available from Oriel Instruments. The mechanical stage 204 is driven by the encoded motor actuator 206. The computer 208 controls the encoded motor actuator 206. Bump coordinates for directing the beam of energy 104 to I/O pads 108 may be entered as input to the computer 208 as X-Y coordinates or as a bump map CAD file. Once the bump coordinates are entered, the computer 208 determines the optimum scan sequence in terms of a minimum number of scan lines. The computer 208 can then control the encoded motor actuator 206 to drive the mechanical stage 204 to scan the beam of energy 104 to each I/O pad 108. An advantage of the wafer bump processor 100 is that the wafer bumping process may run by the computer 208 unattended, for example, at night.

The beam scanner 102 may also be implemented by a 3-D modeling device such as described in U.S. Pat. No. 5,870,307 issued on Feb. 9, 1999 to Charles W. Hull et al. and in U.S. Pat. No. 5,133,987 issued on Jul. 28, 1992 to Stuart T. Spence et al., incorporated herein by reference. Rapid prototyping systems emerged as the capability of computers to handle large data files improved significantly. In these systems, a computer-controlled robot arm or a scanning device rasters on a two-dimensional surface to deposit a thermoplastic polymer or to solidify a section of a liquid bath or a powder bed according to a set of coordinates that describe the shape of a cross-section of the object to be formed. After one layer has been formed, the same process is repeated for a sequence of layers to form the three-dimensional object. Instead of inputting coordinates of a 3-D model for directing the beam of energy, bump coordinates maybe input to the system for directing the beam of energy 104 to illuminate wafer bump locations on the surface of the processed wafer 110.

Referring now to FIG. 1, the computer 208 controls the beam modulator 112 to pulse the beam of energy 104 after the beam scanner 102 has scanned the beam of energy 104 to the next bump coordinate over one of the I/O pads 108 and the beam of energy 104 has settled. The beam modulator 112 may be, for example, a OC-48/STM-16 modulator available from SDL Integrated Optics Ltd. If a diode laser is used as the energy source 106, the computer 208 can modulate the laser diode by controlling the drive current to the diode laser. Alternatively, a mechanical shutter may be used as the beam modulator 112 to expose each bump area to the beam of energy 104. The mechanical shutter may be, for example, an SR 540 Optical Chopper available from Stanford Research Systems, Inc. For repeating I/O pad patterns, multiple beams of energy 104 may be used to process multiple wafer bumps concurrently.

FIG. 3 is a side view pictorial diagram of a method 300 for spreading a layer of an electrically conductive paste for use with the wafer bumping processor of FIG. 1. Shown are the processed wafer 110, an electrically conductive paste 302, a doctor's blade 304, a layer 306 of the electrically conductive paste 302, and a wafer handling stage 308.

The electrically conductive paste 302 may be, for example, a solder paste or a photo-curable conductive polymer. The solder paste should have a particle size distribution modulus of about 0.37. Solder pastes of this type are available from Indium Corporation Of America. Alternatively, a photo-curable polymer may be used, such as SL 7520 available from 3D systems, Inc.

The electrically conductive paste 302 significantly affects the resulting bump yield. The properties of the electrically conductive paste 302 depend on the properties of the solid filler, the solvent, the organic additives, and the solid loading. Solid loading is the ratio of the weight of the solid filler to the weight of the polymer additives and the solvent. The properties of the solid filler include the particle size, the particle size distribution, the particle shape, and the particle material. The solder paste or conductive polymer preferably manifests the characteristic of shear thinning for even spreading.

The doctor's blade 304 spreads the layer 306 of the electrically conductive paste 302 over the I/O pads 108 on a surface of the processed wafer 110. Alternatively, a squeegee or a roller mechanism may be used to spread the layer 306. The thickness of the layer 306 depends on the power of the beam of energy 104, the pulse width of the beam modulator 112, the solid material in the electrically conductive paste 302, and the desired bump size. A typical thickness for the electrically conductive paste 302 is slightly larger than the desired bump width, typically about 100 microns. Currently available paste spreading devices for spreading electrically conductive paste on stencils over processed wafers may be used to spread the electrically conductive paste 302 directly on the surface of the processed wafer 110.

FIG. 4A is an enlarged side view of a beam-paste interaction produced by the wafer bumping processor 100 of FIG. 1. Shown are the beam of energy 104 from FIG. 1, two of the I/O pads 108 from FIG. 1, the processed wafer 110 from FIG. 1, the layer 306 of the electrically conductive paste 302 from FIG. 3, and a beam-paste interaction volume 402.

In operation, the layer 306 of the electrically conductive paste 302 is first applied to the processed wafer 110 as described above in the description of FIG. 3. Next, the beam of energy 104 is positioned over one of the I/O pads 108 and pulsed to expose the beam-paste interaction volume 402 to the beam of energy 104. If the layer 306 is made of a solder paste, then the solder paste within the beam-paste interaction volume 402 is partially melted by the beam of energy 104 to form an agglomerate that bonds to a bump area reserved on the I/O pad 108 for the wafer bump. If the layer 306 is made of a conductive polymer, then the conductive polymer within the beam-paste interaction volume 402 is cured by the beam of energy 104 and bonds to the bump area. The dimensions of the beam-paste interaction volume 402 may be adjusted by varying the power of the beam of energy 104, and also by selecting the width and shape of the beam pulse that is passed by the beam modulator 112. If a diode laser is used to generate the beam of energy 104, the diode laser drive current may be modulated to control heating rate of the electrically conductive paste 302 to prevent spattering. Examples of pulse shapes that may be used are step functions and sinusoidal functions, which may be incorporated into software for use with the computer 208 according to well known techniques. The pulse shape and pulse width may then be selected from a software user interface to the computer 208 to suit each application.

FIG. 4B is an enlarged side view of wafer bumps produced by the wafer bumping processor 100 of FIG. 1. Shown are the I/O pads 108, the processed wafer 110, the beam-paste interaction volume 402, a paste remover 404, and the wafer bumps 406. After all of the I/O pads 108 on the processed wafer 110 have been scanned by the beam scanner 102, the processed wafer 110 is washed by the paste remover 404 to remove the remainder of the layer 306 in the region surrounding the I/O pads 108, leaving behind the wafer bumps 406 that were formed by the beam of energy 104 within each beam-paste interaction volume 402. If desired, the processed wafer 110 may be subjected to a reflow process (not shown) according to well known techniques to ensure uniformity of shape and bond strength of the wafer bumps 406. Also, the scanning of the I/O pads 108 by the beam scanner 102 may be repeated to secure the bonding of the agglomerate to the I/O pads 108.

FIG. 5 is a pictorial diagram of a wafer bumping processor 500 in which the beam of energy is fixed, and the processed wafer is moved from one position to another under the beam of energy by a positioning device. In this example, the positioning device is a mechanical stage. Shown are a beam of energy 504, an energy source 506, I/O pads 508, a processed wafer 510, and a mechanical stage 512. The energy source 506 generates the beam of energy 504. In this example, the energy source 506 is a diode laser, however other lasers and energy sources suitable for wafer bumping may also be used. The operation of the wafer bumping processor 500 is similar to that of FIG. 1, except that the beam of energy 504 is fixed. The mechanical stage 512 positions the processed wafer 510 to expose each of the I/O pads 508 to the beam of energy 504, while in FIG. 1 the processed wafer 110 is fixed, and the beam scanner 102 positions the beam of energy 104. In other arrangements, both the beam of energy 104 and the processed wafer 110 may be moved to expose the I/O pads 108 to the beam of energy 104.

While the invention herein disclosed has been described by means of specific embodiments and applications thereof, numerous modifications and variations could be made thereto by those skilled in the art without departing from the scope of the invention defined by the following claims.

What is claimed is:

1. A method for wafer bumping comprising the following steps:
   (a) spreading a layer of a conductive, photo-curable polymer on a surface having a plurality of electrical contacts; and
   (b) exposing a beam-paste interaction volume to a beam of energy to cure a portion of the layer of the photo-curable polymer within the beam-paste interaction volume and to bond the portion of the layer of the photo-curable polymer to at least one of the plurality of electrical contacts for forming a wafer bump.

2. The method of claim 1 further comprising after step (b) the step of (c) removing a remainder of the layer of the photo-curable polymer from a region of the surface surrounding the at least one of the plurality of electrical contacts.

3. The method of claim 1 wherein the beam of energy is a laser beam.

4. The method of claim 1 wherein step (b) comprises modulating the beam of energy.

5. The method of claim 1 wherein step (b) comprises concentrating the beam of energy on the beam-paste interaction volume.

6. The method of claim 1 wherein step (b) comprises moving the beam of energy to a position for exposing the beam-paste interaction volume to the beam of energy.

7. The method of claim 1 wherein step (b) comprises moving the at least one of the plurality of electrical contacts to a position for exposing the beam-paste interaction volume to the beam of energy.

8. The method of claim 1 wherein the surface is a surface of a processed wafer and the at least one of the plurality of electrical contacts is an I/O pad formed on the surface of the processed wafer.

9. The method of claim 1 wherein step (b) comprises generating multiple beams of energy for forming wafer bumps on at least two of the plurality of electrical contacts concurrently.

* * * * *